US009090477B2

(12) United States Patent
Park et al.

(10) Patent No.: US 9,090,477 B2
(45) Date of Patent: Jul. 28, 2015

(54) METHOD OF MANUFACTURING SILICA NANOWIRES

(75) Inventors: Sanghyun Park, Anyang-si (KR); Jaeyeong Heo, Cambridge, MA (US); Hyeong Joon Kim, Seongnam-si (KR)

(73) Assignee: SNU R&DB FOUNDATION (KR)

( * ) Notice: Subject to any disclaimer, the term of this patent is extended or adjusted under 35 U.S.C. 154(b) by 1156 days.

(21) Appl. No.: 12/981,727

(22) Filed: Dec. 30, 2010

(65) Prior Publication Data
US 2011/0159286 A1  Jun. 30, 2011

(30) Foreign Application Priority Data

Dec. 31, 2009 (KR) .................. 10-2009-0136199

(51) Int. Cl.
*C23C 16/40* (2006.01)
*B82Y 40/00* (2011.01)
*C01B 33/12* (2006.01)
*B82Y 30/00* (2011.01)
*C23C 16/02* (2006.01)

(52) U.S. Cl.
CPC ............... *C01B 33/12* (2013.01); *B82Y 30/00* (2013.01); *B82Y 40/00* (2013.01); *C23C 16/02* (2013.01); *C23C 16/402* (2013.01); *C01P 2002/70* (2013.01); *C01P 2002/82* (2013.01); *C01P 2004/03* (2013.01); *C01P 2004/04* (2013.01); *C01P 2004/16* (2013.01); *C01P 2004/64* (2013.01); *Y10T 428/296* (2015.01); *Y10T 428/2933* (2015.01)

(58) Field of Classification Search
CPC ...... C23C 16/402; B82Y 40/00; C01B 33/12; C01P 2004/16
USPC .................... 427/117, 126.3, 255.29, 255.31
See application file for complete search history.

(56) References Cited

U.S. PATENT DOCUMENTS

| | | | |
|---|---|---|---|
| 2002/0001977 A1* | 1/2002 | Gole et al. | 438/800 |
| 2004/0112964 A1* | 6/2004 | Empedocles et al. | 235/491 |
| 2004/0137214 A1* | 7/2004 | Chen et al. | 428/323 |
| 2005/0079659 A1* | 4/2005 | Duan et al. | 438/197 |
| 2005/0207713 A1* | 9/2005 | Mazur et al. | 385/123 |
| 2007/0095276 A1* | 5/2007 | Sunkara et al. | 117/103 |
| 2008/0057199 A1* | 3/2008 | Fujita et al. | 427/255.29 |
| 2008/0075872 A1* | 3/2008 | Lichtenhan et al. | 427/387 |
| 2008/0119098 A1* | 5/2008 | Palley et al. | 442/64 |
| 2009/0165846 A1* | 7/2009 | Johannes et al. | 136/256 |
| 2010/0084628 A1* | 4/2010 | Lee et al. | 257/9 |
| 2013/0330936 A1* | 12/2013 | Lachaud et al. | 438/787 |
| 2014/0154417 A1* | 6/2014 | Choi et al. | 427/255.28 |

OTHER PUBLICATIONS

Sekhar, Praveen Kumar, et al., "Selective growth of silica nanowires in silicon catalysed by Pt thin film." Nanotechnology 17 (2006) 4606-4613.*

(Continued)

*Primary Examiner* — Bret Chen

(57) ABSTRACT

A method of manufacturing silica nanowires includes: providing an object to be processed into a reaction chamber; supplying a precursor having a heteroleptic structure, which has a chemical formula $SiA_2B_2$ (A and B are different functional groups), into the reaction chamber; supplying an oxygen-containing gas that preferentially reacts with any one of the functional groups A and B of the precursor; and growing an intermediate on a surface of the object to be processed due to a reaction between the precursor and the oxygen-containing gas.

13 Claims, 17 Drawing Sheets

(56) References Cited

OTHER PUBLICATIONS

Fan, Shoushan, et al., "Growth of semiconductor nanowires on iron-patterned silicon substrates". Materials Science and Engineering C 15 (2001) 295-297.*

Schmidt, Volker, et al., "Silicon Nanowires: A Review on Aspects of their Growth and their Electrical Properties". Advanced Materials, 2009, 21, 2681-2702.*

Ehrlich, D.J., et al., "Fast room-temperature growth of SiO2 films by molecular-layer doping". Appl. Phys. Lett. 58 (23), Jun. 10, 1991, pp. 2675-2677.*

Won, Seok-Jun, et al., "Growth and electrical properties of silicon oxide grown by atomic layer deposition using Bis(ethyl-methyl-amino)silane and ozone". J. Vac. Sci. Technol. A 30(1), Jan./Feb. 2012, 01A126-1 to 01A126-7.*

* cited by examiner

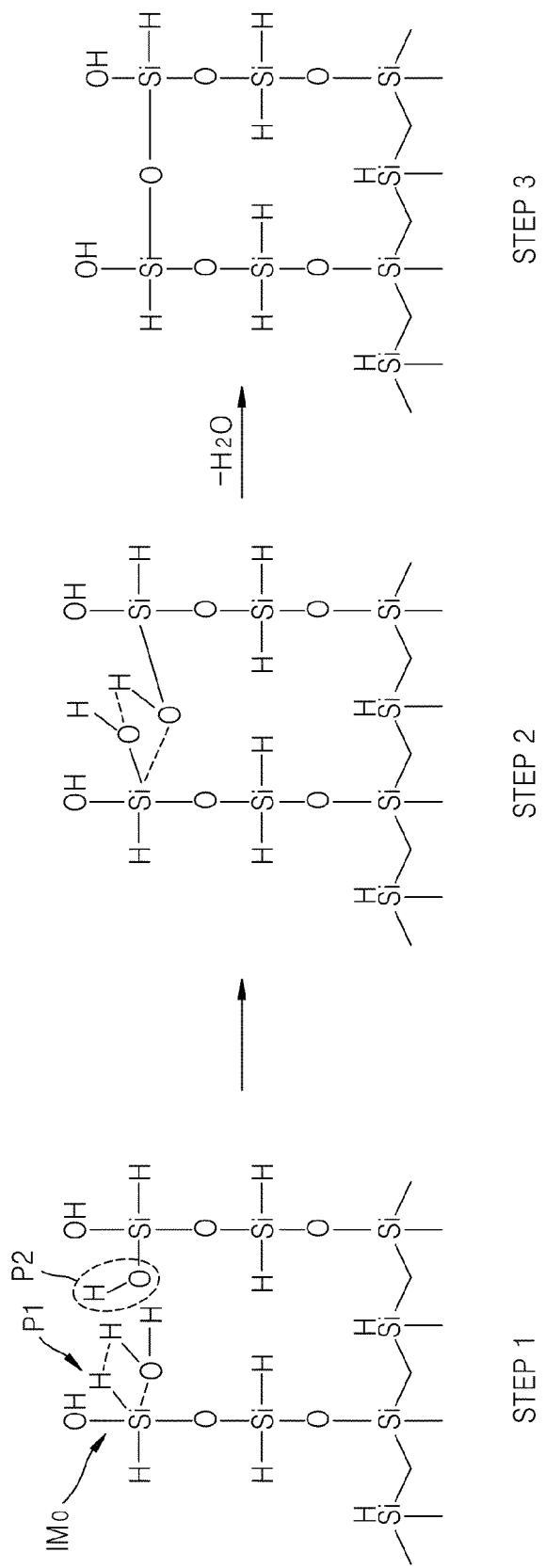

METHOD OF MANUFACTURING SILICA NANOWIRES

CROSS-REFERENCE TO RELATED PATENT APPLICATION

This application claims the benefit of Korean Patent Application No. 10-2010-0136199, filed on Dec. 31, 2009, in the Korean Intellectual Property Office, the disclosure of which is incorporated herein in its entirety by reference.

BACKGROUND OF THE INVENTION

1. Field of the Invention

The present invention relates to a method of manufacturing nanostructures, and more particularly, to a method of manufacturing silica nanowires.

2. Description of the Related Art

Since structures of carbon nanotubes were reported in 1991, research has been actively conducted on a method of synthesizing and using nanostructures having sizes equal to or less than 100 nm Nanostructures may be formed of single component semiconductors (e.g., Si, Ge, and B), III-V compound semiconductors (e.g., GaN, GaAs, GnP, InP, and InAs), II-VII compound semiconductors (e.g., ZnS, ZnSe, CdS, and CdSe), or oxides (e.g., ZnO, MgO, and $SiO_2$).

As diameters of nanowires having one-dimensional structures decrease, band gaps increase and thus light having shorter wavelengths is obtained. Thus, there has been a recent attempt to apply nanowires to light-emitting devices having quantum confinement effects. In particular, since $SiO_2$ nanowires may emit stable and strong blue light or ultraviolet light, the use of $SiO_2$ nanowires for nanoscale optoelectronic devices has been spotlighted.

Examples of a method of manufacturing $SiO_2$ nanowires include laser ablation, high temperature evaporation, carbothermal reduction. Besides, there is a method of growing $SiO_2$ nanowires on a substrate by using a silicon-containing gas such as $SiCl_4$ and a catalyst such as gold. However, since these methods manufacture nanowires by using a vapor-liquid-solid (VLS) mechanism, a high temperature equal to or higher than 1000° C. and a long reaction time are required. Accordingly, there is a limitation in integrating silica nanowires with other members.

SUMMARY OF THE INVENTION

The present invention provides a method of manufacturing silica nanowires which may rapidly manufacture silica nanowires without a catalyst even at a low temperature and may easily control sizes and shapes of the manufactured silica nanowires.

The present invention also provides a nanostructure array and a method of manufacturing the nanostructure array by using silica nanowires having the aforesaid advantages as templates.

According to an aspect of the present invention, there is provided a method of manufacturing silica nanowires, the method including: providing an object to be processed into a reaction chamber; supplying a precursor having a heteroleptic structure, which has a chemical forma $SiA_2B_2$ (A and B are different functional groups), into the reaction chamber; supplying an oxygen-containing gas that preferentially reacts with any one of the functional groups A and B of the precursor; and growing an intermediate on a surface of the object to be processed due to a reaction between the precursor and the oxygen-containing gas.

In some embodiments, the intermediate may undergo a condensation reaction with the precursor and the oxygen-containing gas. Also, the functional group A may be an amine group and the functional group B may be a hydrogen group. The amine group may be —NR1R2 (R1 and R2 are hydrocarbon compounds). The hydrocarbon compounds may be an alkyl group. In some embodiments, the precursor may be a bis(ethyl-methyl-amino) silane compound. The oxygen-containing gas may include a hydroxyl group. In some embodiments, the oxygen-containing gas may be $H_2O$.

In some embodiments, the method may further include, before the supplying of the precursor, cleaning the surface of the object to be processed. The cleaning may include cleaning the surface of the object to be processed by using alcohol. In some embodiments, the method may further include, before the supplying of the precursor, hydrating the surface of the object to be processed to increase a nucleation site.

A temperature of the object to be processed may be maintained between 0° C. and 60° C. A temperature of the object to be processed may be maintained between 20° C. and 30° C. The precursor may be liquid at room temperature. A pressure of the reaction chamber may range from 100 mtorr to 300 Torr, and preferably, from 4 torr to 15 Torr. In some embodiments, pressure of the reaction chamber may be determined in order to control a longitudinal growth and a lateral growth of the silica nanowires.

According to another aspect of the present invention, there is provided a method of manufacturing silicon nanowires, the method including providing an object to be processed, whose surface has a hydroxyl group, into a reaction chamber. Next, the method includes supplying a precursor having a heteroleptic structure, which has a chemical formula $SiA_2B_2$ (A and B are different functional groups), into the reaction chamber. Also, the method includes supplying an oxygen-containing gas having a functional group that may selectively replace any one of the functional groups A and B of the precursor with a hydroxyl group. The method includes growing an intermediate formed by a reaction between the precursor and the oxygen-containing gas on the surface of the object to be processed due to a condensation reaction.

According to another aspect of the present invention, there is provided a method of manufacturing silica nanowires by using atomic layer deposition. The method includes: providing an object to be processed into a reaction chamber; pulsing a precursor having a heteroleptic structure, which has a chemical formula $SiA_2B_2$ (A and B are different functional groups), into the reaction chamber; pulsing a purge gas into the reaction chamber in order to remove an excess precursor gas remaining in the reaction chamber after forming a first intermediate by a first reaction between the precursor and a surface of the object to be processed; supplying an oxygen-containing gas that preferentially reacts with any one of the functional groups A and B of the precursor; pulsing a purge gas into the reaction chamber in order to remove the excess oxygen-containing gas remaining in the reaction chamber after forming a second intermediate by a second reaction between the oxygen-containing gas and the surface of the object to be processed; and repeating operations ranging from the pulsing of the precursor to the pulsing of the purge gas at least one time.

In some embodiments, the first and second reactions may include at least one of a hydrolysis reaction and a condensation reaction. Also, the functional group A may be an amine group and the functional group B may be a hydrogen group. The amine group may be —NR1R2 and R1 and R2 may be hydrocarbon compounds. The hydrocarbon may be an alkyl group. In some embodiments, the precursor may be a bis (ethyl-methyl-amino) silane compound.

The oxygen-containing gas may include a hydroxyl group. In some embodiments, the oxygen-containing gas may be $H_2O$. In some embodiments, before the pulsing of the precursor, the method may further include washing the surface of the object to be processed. The washing may include washing the surface of the object to be processed by using alcohol. In some embodiments, before the pulsing of the precursor, the method may further include hydrating the surface of the object to be processed to increase a nucleation site.

A temperature of the object to be processed may be maintained between 0° C. and 60° C., and preferably, between 20° C. and 30° C. that is room temperature. A pressure of the reaction chamber may range from 100 mtorr to 300 Torr, and preferably, from 4 torr to 15 Torr. In some embodiments, a pressure of the reaction chamber may be appropriately determined in order to control a longitudinal growth and a lateral growth of the silica nanowires.

Also, according to another aspect of the present invention, there is provided a method of manufacturing a nanostructure array, the method including: after forming silica nanowires by the method, coating at least one material layer formed of a metal, a metal oxide, a polymer, or a combination thereof, on outer surfaces of the silicon nanowires by using the silica nanowires as templates.

BRIEF DESCRIPTION OF THE DRAWINGS

The above and other features and advantages of the present invention will become more apparent by describing in detail exemplary embodiments thereof with reference to the attached drawings in which:

FIGS. 11A and 11B conceptually illustrate a cross-linking reaction between intermediates formed on a surface of a silicon substrate by using a precursor having a heteroleptic structure that has a chemical formula $SiA_2B_2$;

DETAILED DESCRIPTION OF THE INVENTION

Figure 1:
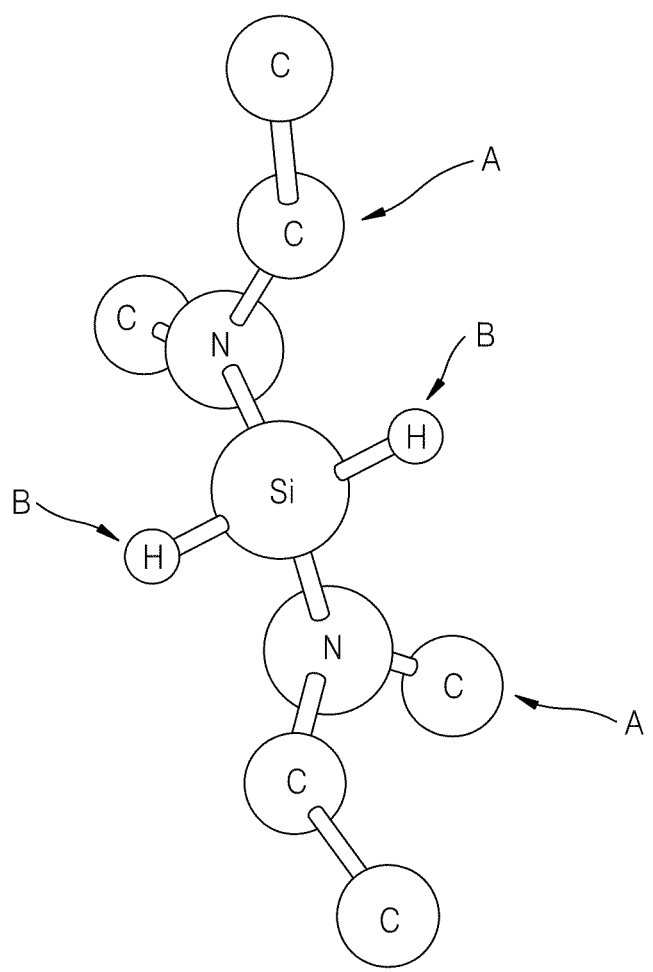
FIG. 1 illustrates a bis(ethyl-methyl-amino) silane precursor having a heteroleptic structure according to an embodiment of the present invention.

The present invention will now be described more fully with reference to the accompanying drawings, in which exemplary embodiments of the invention are shown.

Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In an embodiment of the present invention, a precursor for manufacturing silica nanowires has a heteroleptic structure that is expressed by a chemical formula $SiA_2B_2$ where A and B are different functional groups. The functional groups A and B are attached by twos to silicon (Si), which is a central atom, to form a silane compound having a tetrahedral structure.

The functional groups A and B of the precursor have reactivities that are sterically or electrically different from each other. For example, if the functional group A is an amine group and the functional group B is hydrogen, since the amine group has a larger volume than the hydrogen, the amine group may have sterically a higher reactivity, and since nitrogen of the amine group has a high electronegativity, the amine group also may have electrically a higher reactivity than the hydrogen.

The amine group may be any one of a primary amine group such as —NHR1 and a secondary amine group such as —NR1R2. In some embodiments of the present invention, R1 and R2 may be hydrocarbon compounds, and the hydrocarbon compounds may have sterically a higher reactivity than hydrogen attached to silicon. As a result, since the functional group A may preferentially (or selectively) react with a surface of a substrate and a reaction gas as described later, and a subsequent reaction continuously occurs only in a direction in which the specific functional group A is attached to the silicon, silica products such as one-dimensional nanowires which are grown in a linear direction may be provided.

The term 'nanowires' used herein refers to a solid structure having a small diameter (or thickness), a length greater than the diameter, and a ratio (an aspect ratio) of the length to the diameter which is equal to or greater than at least 3. Sometimes, nanowires may be called nanorods or nanowhiskers, and the present invention is not limited to these terms.

The term 'object to be processed' used herein refers to an arbitrary part or support member having an optical, electrical, magnetic, mechanical, or chemical function which may be applied to an optical device, an optoelectronic device, a super conductivity device, a memory device, electrical energy storage device, or display device having a surface on which silica nanowires are to be grown. The terms 'wafer' and 'substrate' used as an example of an object to be professed herein may refer to a silicon semiconductor layer, a doped or undoped semiconductor layer, or a strained semiconductor layer on a substrate structure such as bulk silicon, silicon-on-insulator (SOI) and silicon-on-sapphire (SOS). Also, the term 'wafer' or 'substrate' is not limited to a silicon-based material wafer, and may refer to a group III-V semiconductor material substrate such as a silicon-germanium, or germanium or gallium-arsenic-based compound material substrate.

Also, the term 'substrate' may refer to not only the aforesaid inorganic material substrate but also a polymer-based organic material substrate, and preferably, a flexible substrate. Surfaces of these objects to be processed may be flat or have an appropriate unevenness.

FIG. 1 illustrates a bis(ethyl-methyl-amino) silane precursor having a heteroleptic structure, according to an embodiment of the present invention.

Referring to FIG. 1, the precursor has a chemical formula $SiH_2[N(CH_3)(C_2H_5)]_2$. As described above, the amine group $-N(CH_3)(C_2H_5)$ attached to silicon has a higher reactivity than the hydrogen group attached to the silicon. For example, when the precursor collides with a water molecule, the amine group is expected to more easily react than the hydrogen attached to silicon. Such a feature will be more apparent from the following detailed description.

The precursor illustrated in FIG. 1 is exemplary and the present invention is not limited thereto. For example, functional groups derived from a hydrocarbon compound such as alkane, alkene, and alkyne, other than a methyl group and an ethyl group, may be attached to the nitrogen atom of the amine group. For example, the functional groups may be n-propyl, n-butyl, and isopropyl groups. Also, these functional groups may be arranged in a straight chain, a branched chain, or a ring and a carbon number may be 1 to 6, but the present embodiment is not limited thereto.

It is convenient to handle the precursor when the precursor is liquid at room temperature. Accordingly, a compound having a heteroleptic structure with a vapor pressure that is low enough for the compound to be liquid at room temperature may be used as the precursor.

Figure 2A:
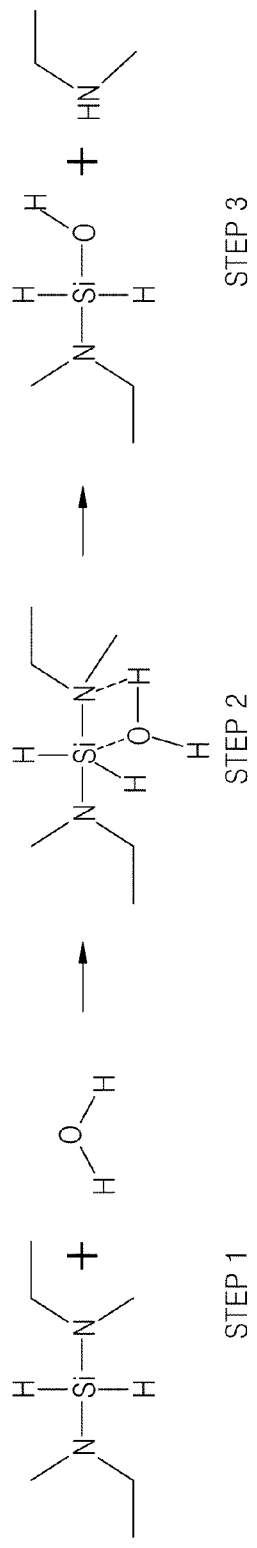
FIGS. 2A through 2C schematically illustrate various intermediates which the bis(ethyl-methyl-amino) silane precursor of FIG. 1 has and a reaction mechanism of the various intermediates, according to an embodiment of the present invention.
Figure 2B:
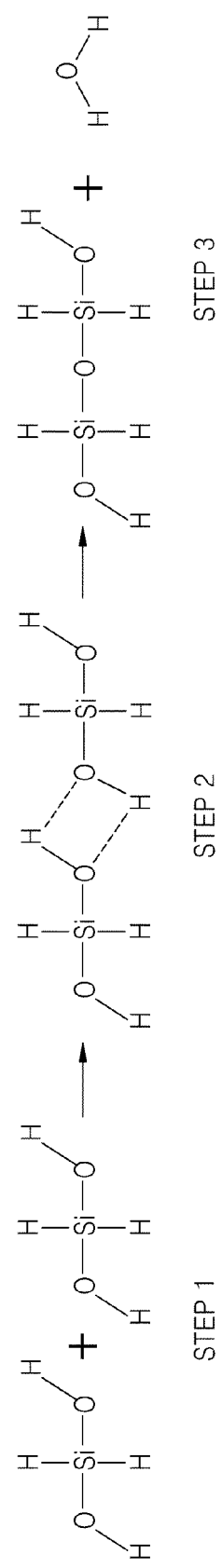
Figure 2C:
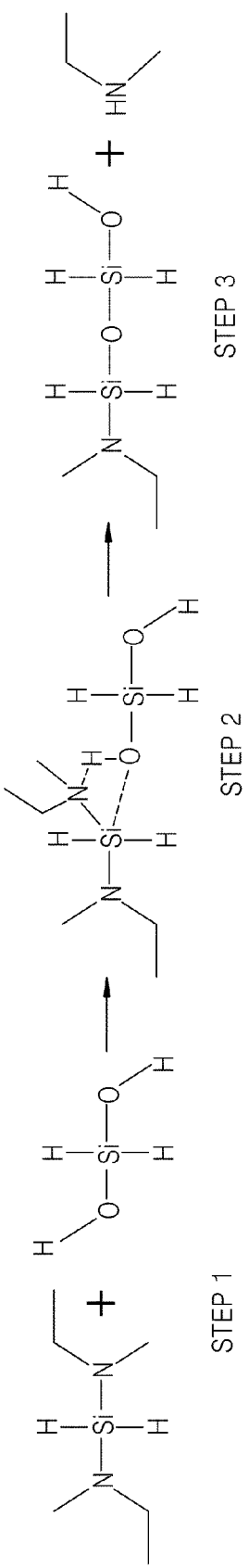

FIGS. 2A through 2C schematically illustrate various intermediates which the bis(ethyl-methyl-amino) silane precursor of FIG. 1 has and a reaction mechanism of the various intermediates, according to an embodiment of the present invention.

FIG. 2A illustrates a hydrolysis reaction of the bis(ethyl-methyl-amino) silane precursor. In a reaction chamber, the bis(ethyl-methyl-amino) silane precursor and an $H_2O$ gas may coexist (step 1). When the precursor collides with the $H_2O$ gas (step 2), an amino group is attached to hydrogen of a water molecule, and then the amino group is separated as a compound $HNCH_3C_2H_5$ from a silicon (Si) atom, and a hydroxyl group —OH may be attached to the silicon atom (step 3). As a result, the amino group attached to the silicon atom is replaced with the hydroxyl group.

Although not shown in FIG. 2A, another amino group attached to the silicon atom of the precursor may react with the $H_2O$ molecule to be replaced with a hydroxyl group. That is, since two amino groups are all replaced with hydroxyl groups due to a hydrolysis reaction, $SiH_2(OH)_2$ (see step 1 of FIG. 2B) which is an intermediate may be obtained.

FIG. 2B illustrates a condensation reaction of the intermediate $SiH_2(OH)_2$. During the condensation reaction, two intermediates $SiH_2(OH)_2$ illustrated in step 1 are attached to each other by hydroxyl groups (step 2), and one water molecule is removed to undergo oxidation (step 3).

FIG. 2C illustrates another condensation reaction of the bis(ethyl-methyl-amino) silane precursor. The amine group of the bis(ethyl-methyl-amino) silane precursor illustrated in step 1 and the intermediate $SiH_2(OH)_2$ having the aforesaid hydroxyl group may react with each other (step 2). When the amine group and the intermediate react with each other, the amine group is separated as a compound $HN(CH_3)(C_2H_5)$ from the silicon atom, and two silicon atoms may be attached to each other by oxygen atoms (step 3).

Figure 3:
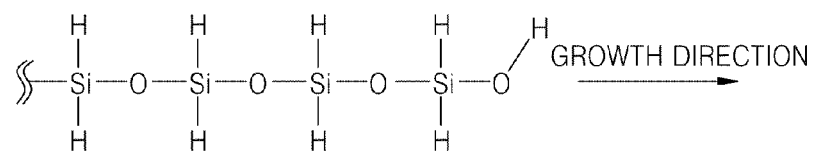
FIG. 3 illustrates a one-dimensional growth of a bis(ethyl-methyl-amino) silane compound.

As shown in FIGS. 2A through 2C, the bis(ethyl-methyl-amino) silane precursor undergoes a hydrolysis reaction and a condensation reaction selectively only at a position where two amine groups are attached, and through an oxidation reaction of a silicon atom, two neighboring silicon atoms are attached by oxygen atoms. If the aforesaid hydrolysis reaction and the condensation reaction occur plural times, as shown in FIG. 3, since silicon atoms continuously undergo the hydrolysis reaction and/or the condensation reaction only in a direction in which a specific functional group, that is, an amine group, is attached, linear one-dimensional structures like wires may be grown.

A method of manufacturing silica nanowires using the aforesaid precursor will now be explained.

Chemical Vapor Deposition

Figure 4:
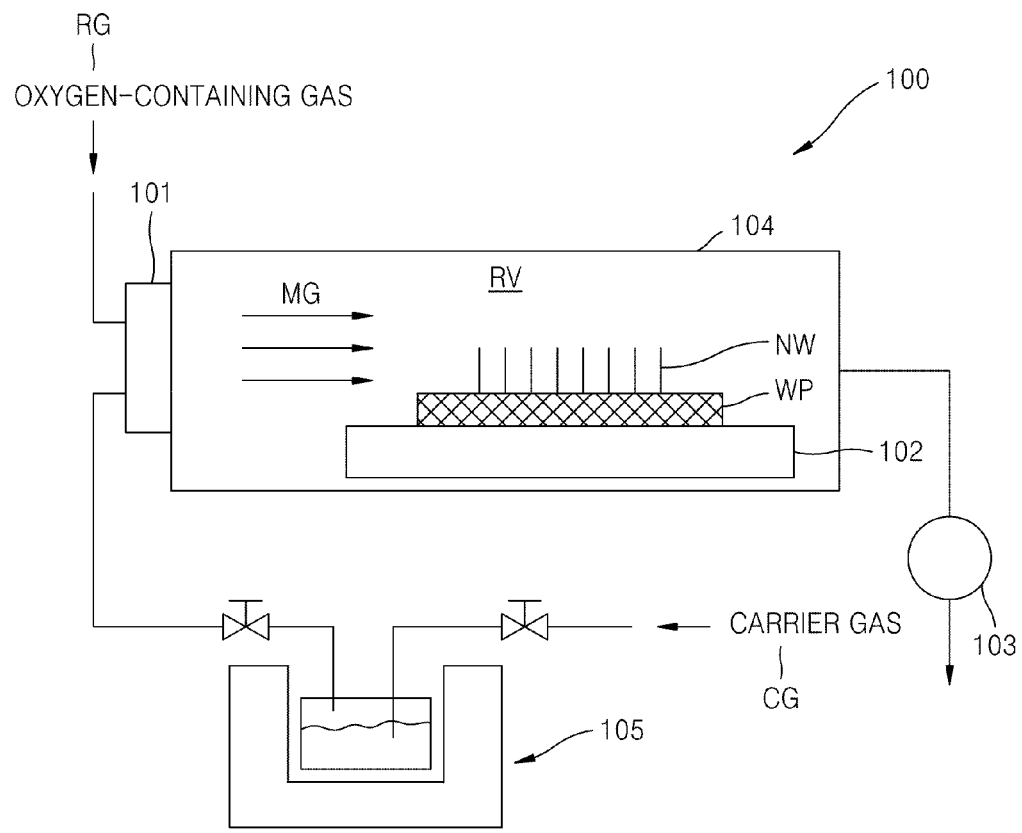
FIG. 4 illustrates a method of manufacturing silica nanowires by using chemical vapor deposition, according to an embodiment of the present invention.

FIG. 4 illustrates a method of manufacturing silica nanowires NW by using chemical vapor deposition, according to an embodiment of the present invention.

Referring to FIG. 4, a deposition system 100 for manufacturing silicon nanowires NW includes a reaction chamber 104. The reaction chamber 104 may include a gas supply unit 101 for introducing reaction gases into a reaction space RV, a support unit 102 for supporting an object to be processed WP such as a substrate, and a pump 103 for discharging gases from the deposition system 100.

The gas supply unit 101 may have an appropriate structure for uniformly mixing the reaction gases in the reaction space RV, for example, an inlet manifold or a shower head, but the present embodiment is not limited thereto. Optionally, the support unit 102 may have a heating member or a coolant passage thereinside in order to heat or cool the object to be processed WP. In some embodiments, in order to heat the object to be processed WP, for example, a high-intensity radiation lamp, an induction heating system, or a laser system may be included. However, it was observed that nanowires were grown at a commercially appropriate deposition rate at room temperature when a heteroleptic precursor according to an embodiment of the present invention was used.

If a precursor is liquid at room temperature, the precursor may be vaporized before being introduced into the reaction chamber 104. To this end, the precursor may be introduced by using a bubbler 105. A $N_2$, Ar, He, or $H_2$ gas may be used as a carrier gas CG of the precursor. Although not shown, a mass flow meter for controlling the amount of a carrier gas may be disposed before the bubbler 105 in order to adjust the amount of a precursor introduced into the reaction chamber 104.

Alternatively, in order to directly control the amount of a precursor introduced into the reaction chamber 104, a direct vapor pressure system or a direct liquid injection (DLI) system instead of the bubbler 105 may be used, but the bubbler 105, the direct vapor pressure system, and the DLI system are exemplary and the present embodiment is not limited thereto.

In order to manufacture silica nanowires NW, the object to be processed WP, for example, a substrate, is loaded on the support unit 102. A single or a batch of substrates may be loaded as well known in the art, and may be transferred from a loadlock chamber (not shown) to the reaction chamber 104 by an appropriate robot. The object to be processed WP may be heated or cooled and maintained at a temperature of about 0° C. to about 60° C., preferably, about 15° C. to about 45° C., and more preferably, about 20° C. to about 30° C. that is room temperature.

In some embodiments, before the object to be processed WP is loaded in the reaction chamber 104, a surface of the object to be processed WP may be cleaned. The object to be processed WP may be cleaned by being dipped in alcohol, such as ethanol or isopropyl alcohol for, for example, about 5 minutes. Since the object to be processed WP is dipped in any of these solutions, an organic compound or metal impurities attached to the surface of the object to be processed WP may be removed. In some embodiments, the object to be processed WP may be cleaned by applying ultrasonic energy. Also, in some embodiments, after the cleaning, the object to be processed WP may be rinsed with deionized (DI) water.

Due to the cleaning, a hydroxyl group may be formed on the surface of the object to be processed WP, for example, a surface of a silicon substrate. The hydroxyl group may provide a nucleation site where silica nanowires are to be formed as described later. Accordingly, it is preferable that a coverage ratio of the hydroxyl group on the surface of the object to be processed WP is adjusted before silica nanowires are deposited.

In some embodiments, in order to increase the coverage ratio of the hydroxyl group on the surface of the object to be processed WP, hydroxylation pre-treatment may be performed. For example, the surface of the object to be processed WP may be exposed to a $H_2O$ gas. The hydroxylation pre-treatment may be performed in the reaction chamber 104, or in a chamber other than the reaction chamber 104. The hydroxylation pre-treatment may be performed for, for example, 2 seconds, in the reaction chamber 104. The coverage ratio of the hydroxyl group on the surface of the object to be processed WP may be controlled by using the hydroxylation pre-treatment, and accordingly a nucleation density of silica nanowires may be controlled.

In the present embodiment, a metal catalyst may not be required to be formed on the object to be processed WP for the purpose of nucleation of silica nanowires. Also, the present inventors observed that if HF is used to remove a native oxide film of a silicon substrate, nucleation of nanowires is reduced.

After the object to be processed WP which has or has not undergone a hydroxylation pre-treatment is loaded on the support unit 102, a mixed gas MG of a precursor and an oxygen-containing gas is introduced into the reaction chamber 104. If the precursor is a bis(ethyl-methyl-amino) silane compound, the precursor may be vaporized by using the bubbler 105. A temperature of the bubbler 105 may be maintained at a temperature of, for example, about 15° C. to about 45° C., and preferably, about 20° C. to about 30° C. that is room temperature. A carrier gas may be argon (Ar), and may be supplied at a flow rate of about 10 SCCM to about 40 SCCM.

The oxygen-containing gas which is a reaction gas RG may be a $H_2O$ gas having a hydroxyl group. The $H_2O$ gas may be obtained by heating and vaporizing DI water to 100° C. A vaporization rate may be, for example, 200 mg/minute. In order to introduce the $H_2O$ gas to the reaction chamber 104, a carrier gas such as Ar may be used, and the carrier gas may be supplied at a flow rate of about 50 SCCM to 200 SCCM.

As such, if the bis(ethyl-methyl-amino) silane compound and the $H_2O$ gas are used as source gases, the mixed gas MG may have not only the precursor but also various intermediates including an intermediate in which at least one of amine groups is replaced with a hydroxyl group as described with reference to FIGS. 2A through 2C.

Figure 5A:
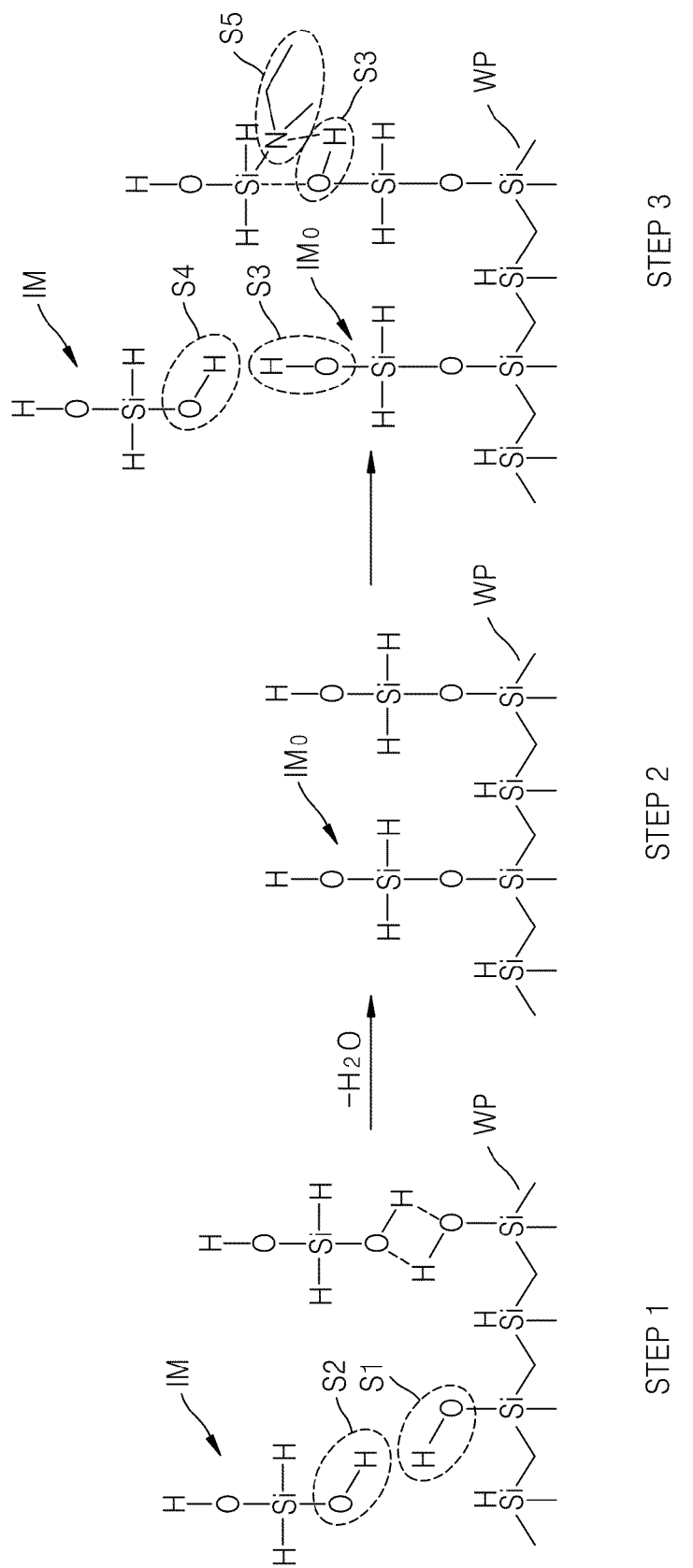
FIGS. 5A and 5B schematically illustrate a process of generating silica nanowires by using chemical vapor deposition, according to embodiments of the present invention.
Figure 5B:
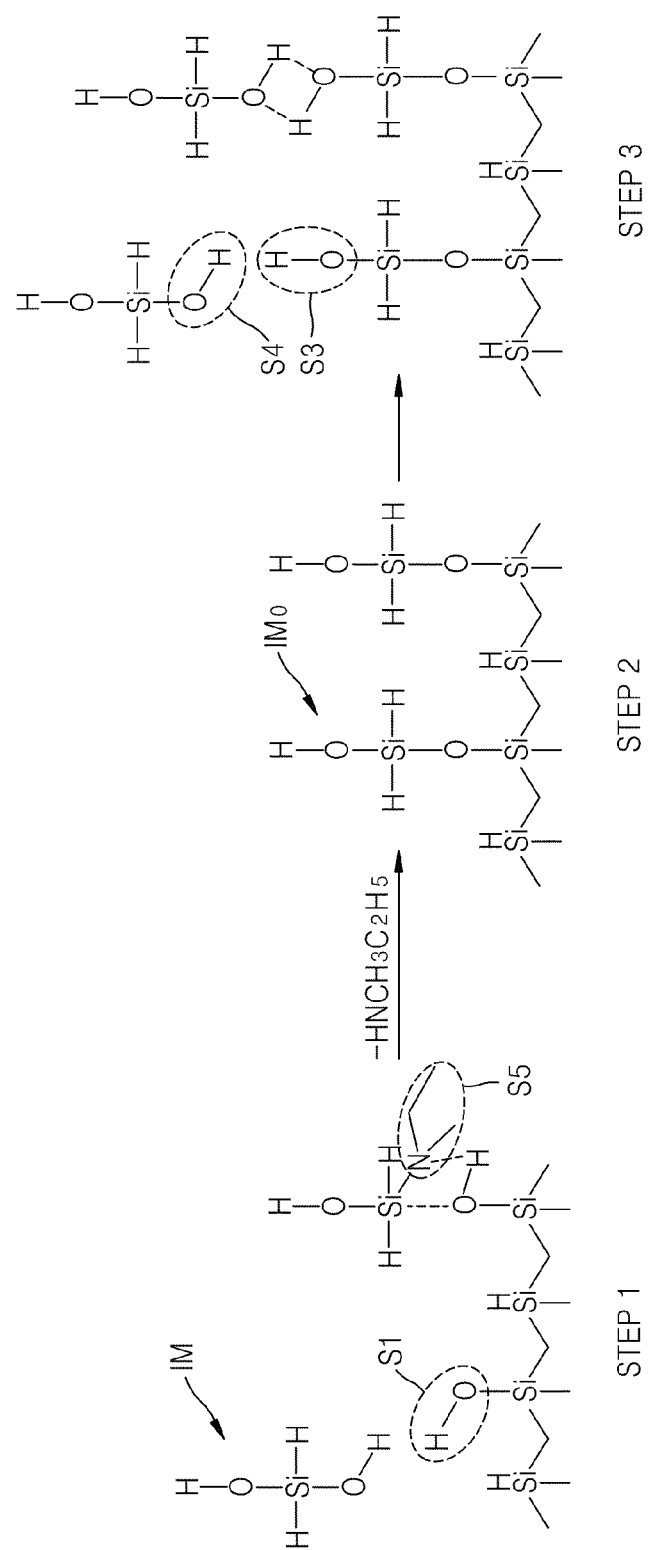

FIGS. 5A and 5B schematically illustrate a process of generating silica nanowires by using chemical vapor deposition, according to embodiments of the present invention.

Referring to FIG. 5A, a silicon substrate having a surface coated with a hydroxyl group S1 at a coverage ratio of, for example, 50%, is loaded as the object to be processed WP on the support unit 102 of the reaction chamber 104. As described above with reference to FIGS. 2A and 2B, due to a hydrolysis reaction between a bis(ethyl-methyl-amino) silane compound that is a precursor and a $H_2O$ gas that is an oxidizing agent, an intermediate IM obtained by replacing an amine group of the precursor with a hydroxyl group S2 may reach the silicon substrate (step 1). In step 1, although the intermediate IM is configured by replacing all of amine groups of the precursor with hydroxyl groups, it would be understood by one of ordinary skill in the art that only one amine group may be replaced with one hydroxyl group.

Due to a condensation reaction between the hydroxyl group S2 of the intermediate IM and the hydroxyl group S1 on the silicon substrate, $H_2O$ is removed and a silicon atom of the intermediate IM and a silicon atom of the silicon substrate are attached to each other by remaining oxygen atom (step 2). Next, as described above with reference to FIG. 2B, a condensation reaction occurs between a hydroxyl group S3 of another end of the intermediate IM attached to the silicon atom of the substrate and a hydroxyl group S4 of each of other intermediates IM, that is, $SiH_2(OH)_2$ and/or $SiH_2NR1(OH)$ which are supplied to the substrate, one $H_2O$ molecule is removed, and neighboring silicon atoms are attached to each other by remaining oxygen atom (step 3).

Alternatively, as described above with reference to FIG. 2C, a condensation reaction may occur between the hydroxyl group S3 of another end of the intermediate IM attached to the silicon atom of the substrate and an amine group S5 of the intermediate or the precursor, one $HN(CH_3)(C_2H_5)$ molecule may be removed, and neighboring silicon atoms may be attached.

As such, as an intermediate attached to a silicon atom of a substrate is exposed to continuously supplied other intermediates and/or a precursor gas, a condensation reaction therebetween may selectively or continuously occur through hydroxyl groups.

Similarly but different from FIG. 5A, in FIG. 5B, a hydroxyl group S1 on the silicon substrate may undergo a condensation reaction with an amine group S5 of an intermediate IM reaching the substrate (step 1). Accordingly, a silicon atom of the intermediate IM and a silicon atom of the silicon substrate are attached by oxygen atoms (step 2). Also, a condensation reaction may occur between a hydroxyl group S3 of another end of the intermediate IM attached to the silicon atom of the substrate and a hydroxyl group S4 of each of other intermediates IM supplied to the substrate, a $H_2O$ molecule may be removed, and neighboring silicon atoms may be attached to each other (step 3).

Figure 6:
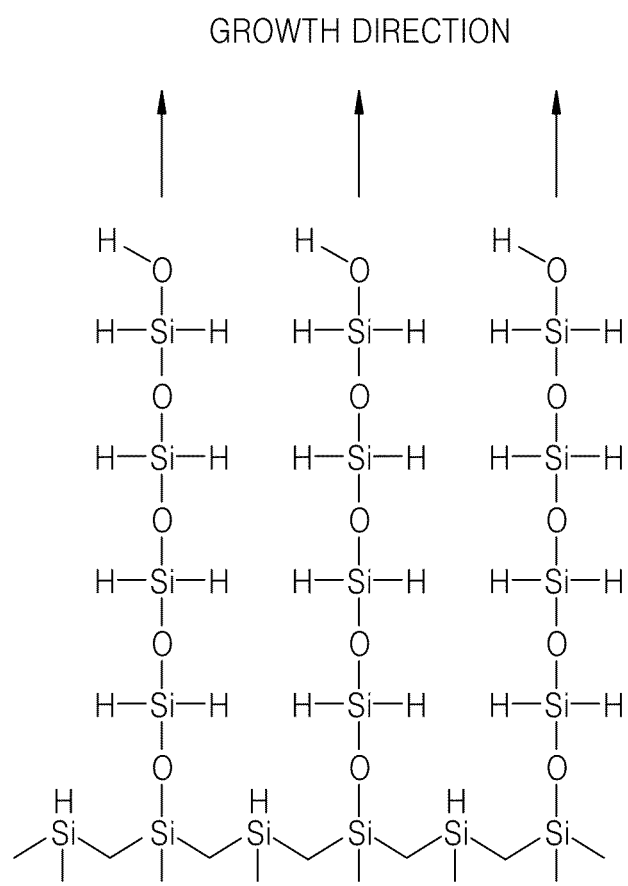
FIG. 6 schematically illustrates a process of generating silica nanowires grown in a one-dimensional linear direction on a silicon substrate.

As described above with reference to FIG. 3, due to a hydrolysis reaction and/or a condensation reaction between an intermediate attached to a silicon substrate and a precursor, an intermediate, and a $H_2O$ gas of a mixed gas that is continuously supplied, silicon atoms thereof are continuously attached, thereby obtaining silica nanowires grown in a one-dimensional linear direction on the substrate as shown in FIG. 6.

FIGS. 7A through 7D are scanning electron microscopic (SEM) images of silica nanowires formed on a silicon substrate S at different process pressures by using chemical vapor deposition. In FIGS. 7A through 7D, a deposition process was performed for about 10 minutes at room temperature when a pressure in a reaction chamber was about 1 Torr, about 2 Torr, about 7 Torr, and about 50 Torr, and a scale bar SB was all 500 nm.

Referring to FIGS. 7A through 7D, it was found that shapes and growth rates of silica nanowires NW are greatly affected by a pressure in the reaction chamber. At a pressure of about 1 Torr, a limited nucleation site was observed and only an initial growth stage of nanowires was observed (see FIG. 7A). This seems because a mixed reaction gas at the process pressure of 1 Torr was not sufficiently transferred to a surface of the silicon substrate S. At a pressure of about 2 Torr, a growth rate was slightly increased to about 0.03 μm/minute (see FIG. 7B). It was observed that each of nanowires grown at pressures of about 1 Torr and 2 Torr has a tapered shape or a cone shape a width of which increases farther away from the silicon substrate S in a longitudinal direction.

Figure 7A:
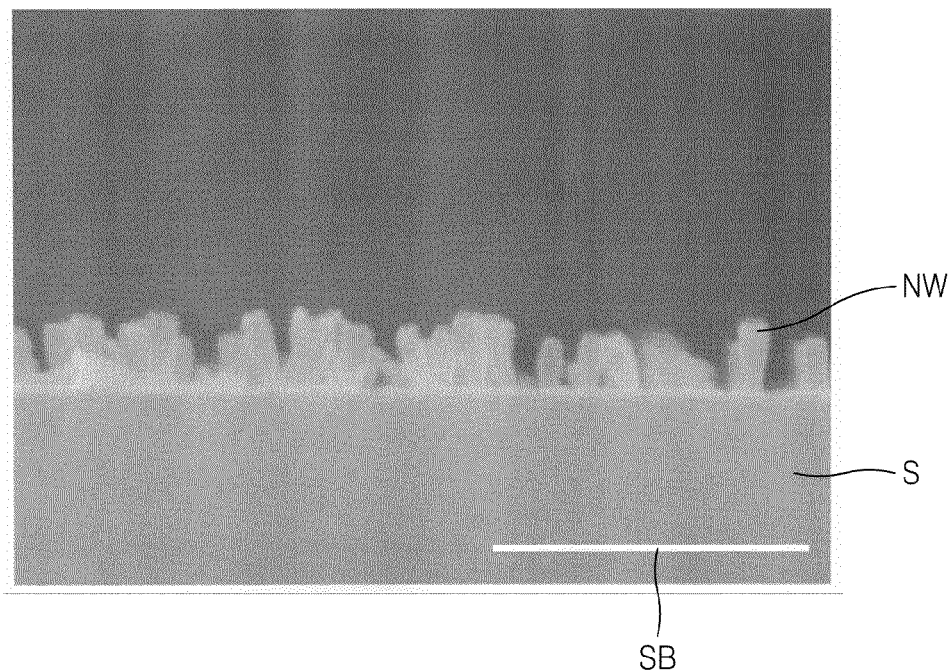
FIGS. 7A through 7D are scanning electron microscopic (SEM) images of silica nanowires formed on a silicon substrate at different process pressures by using chemical vapor deposition.
Figure 7B:
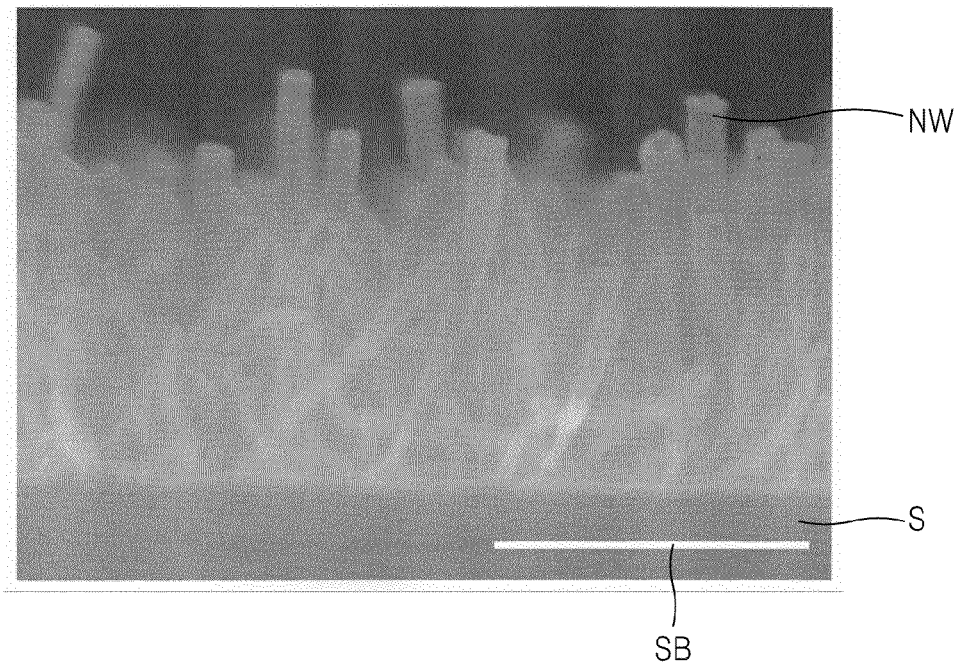
Figure 7C:
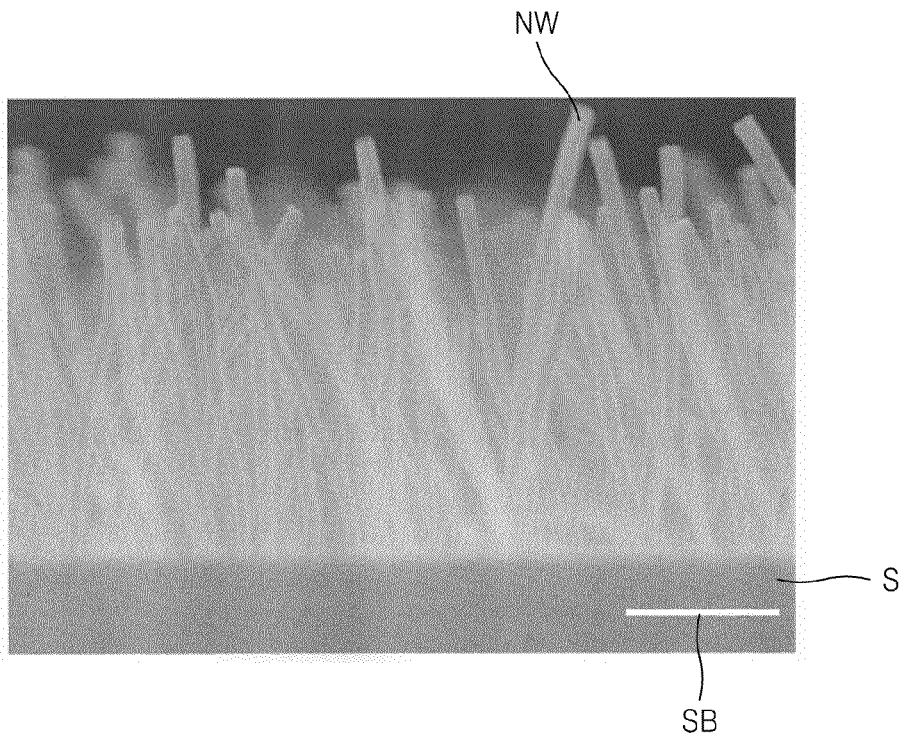
Figure 7D:
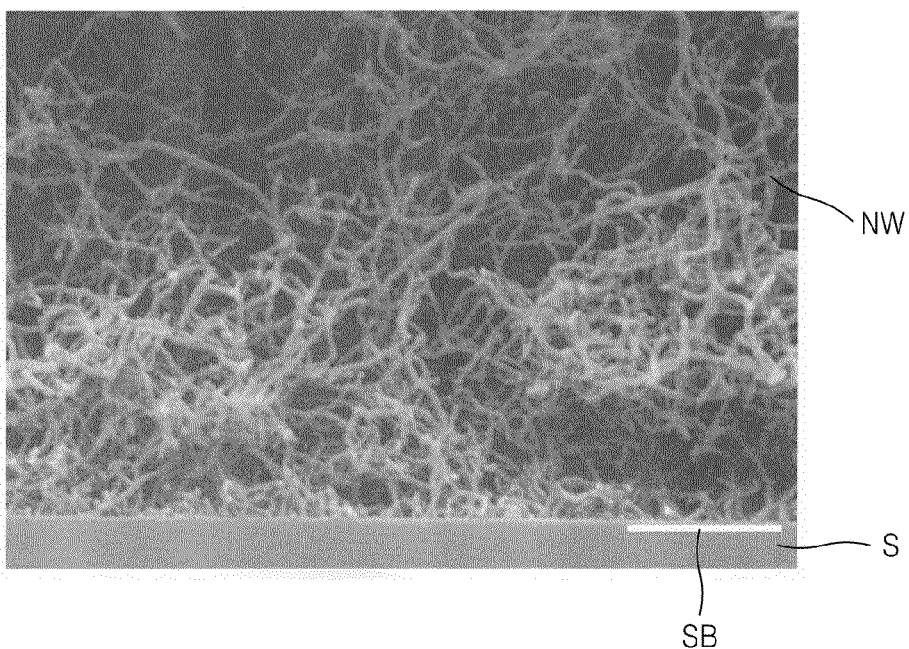

At a pressure of about 7 Torr, silica nanowires each having a length of about 1.9 μm and a uniform thickness of about 60 to 80 nm over the entire length were obtained (see FIG. 7C). In this case, a deposition rate was about 0.19 μm/minute that is a level high enough for practical use. The present inventors confirmed that at a pressure of about 4 Torr to 15 Torr including about 7 Torr, a uniform thickness and a reasonable deposition rate are obtained.

When a pressure was increased to about 50 Torr, silica nanowires were very long but bent and tangled with one another. A deposition rate was increased sharply. This seems because the amount of a reaction gas transferred to a surface of the silicon substrate S was increased. It was observed that thicknesses of the silica nanowires are 200 to 50 nm which are less than those of the silica nanowires grown at a pressure of 4 Torr to 15 Torr.

Atomic Layer Deposition

According to an embodiment of the present invention, silica nanowires may be manufactured by using atomic layer deposition in which deposition at a molecular level is easily controlled. The atomic layer deposition is a modification of the aforesaid chemical vapor deposition, and is called alternatively pulsed-CVD or atomic layer epitaxy.

Figure 8:
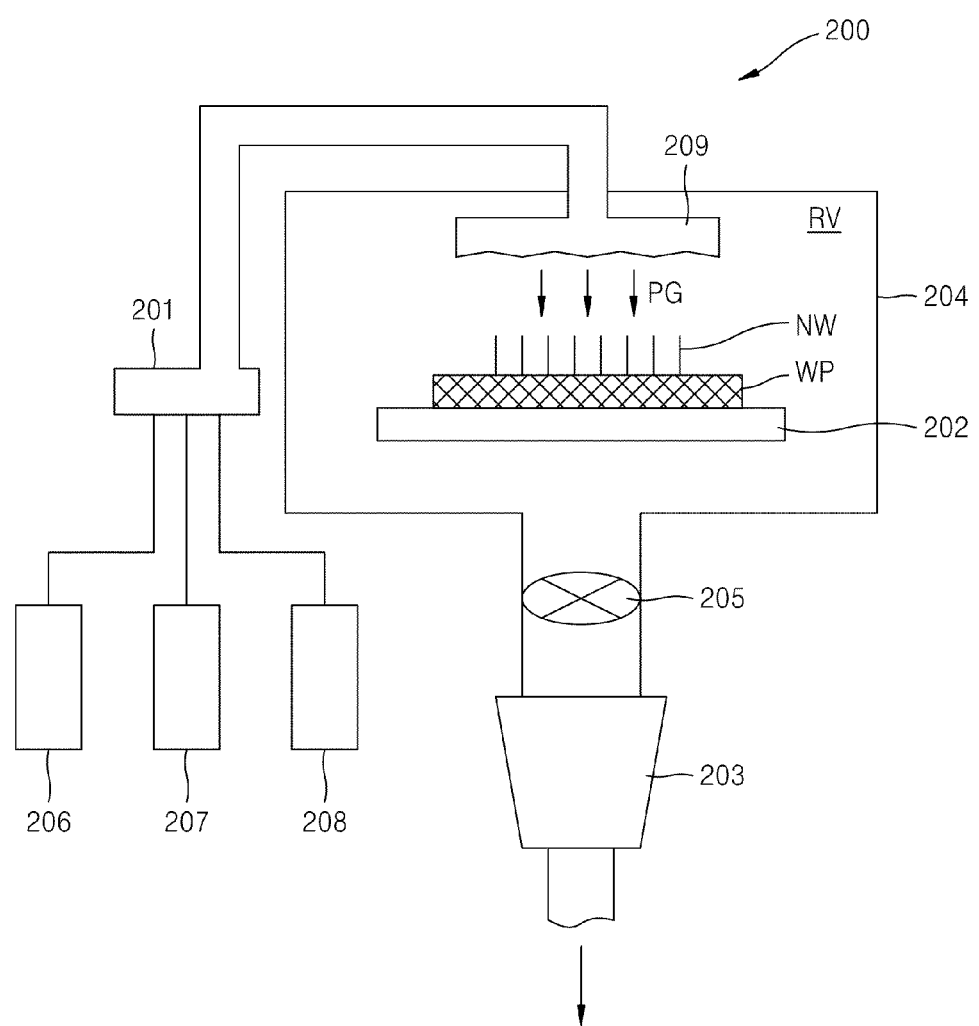
FIG. 8 illustrates an atomic layer deposition system for manufacturing silica nanowires.

FIG. 8 illustrates an atomic layer deposition system 200 for manufacturing silica nanowires. Referring to FIG. 8, the atomic layer deposition system 200 includes a gas control unit 201 for introducing a pulsed gas PG into a reaction space RV, a support unit 202 for supporting an object to be processed WP such as a substrate, and a pump 203 for discharging a gas. A pressure in a reaction chamber 204 may be regulated by a throttle valve 205 connected to the pump 203.

Sources 206, 207, and 208 of a precursor gas, an oxygen-containing gas, and a purge gas are introduced into the reaction chamber 204 through the gas control unit 201. The gas control unit 201 of the atomic layer deposition system 200 alternately supplies the source material gases and a pulse gas through a shower head 209. If a precursor is liquid at room temperature, the precursor may be vaporized by using a bubbler illustrated in FIG. 4 before being introduced into the reaction chamber 204. A carrier gas of the precursor may be a $N_2$, Ar, He, or $H_2$ gas. If the precursor is a bis(ethyl-methyl-amino) silane compound, a temperature of the bubbler may be maintained at a temperature of, for example, about 15° C. to about 45° C., and preferably, about 20° C. to about 30° C. that is room temperature, and a carrier gas may be Ar.

Alternatively, in order to directly control the amount of a precursor introduced into the reaction chamber 204, the precursor may be supplied by using a direct vapor pressure system or a DLI system instead of the bubbler. However, the bubbler, the direct vapor pressure system, and the DLI system are exemplary, and the present embodiment is not limited thereto.

Figure 9:
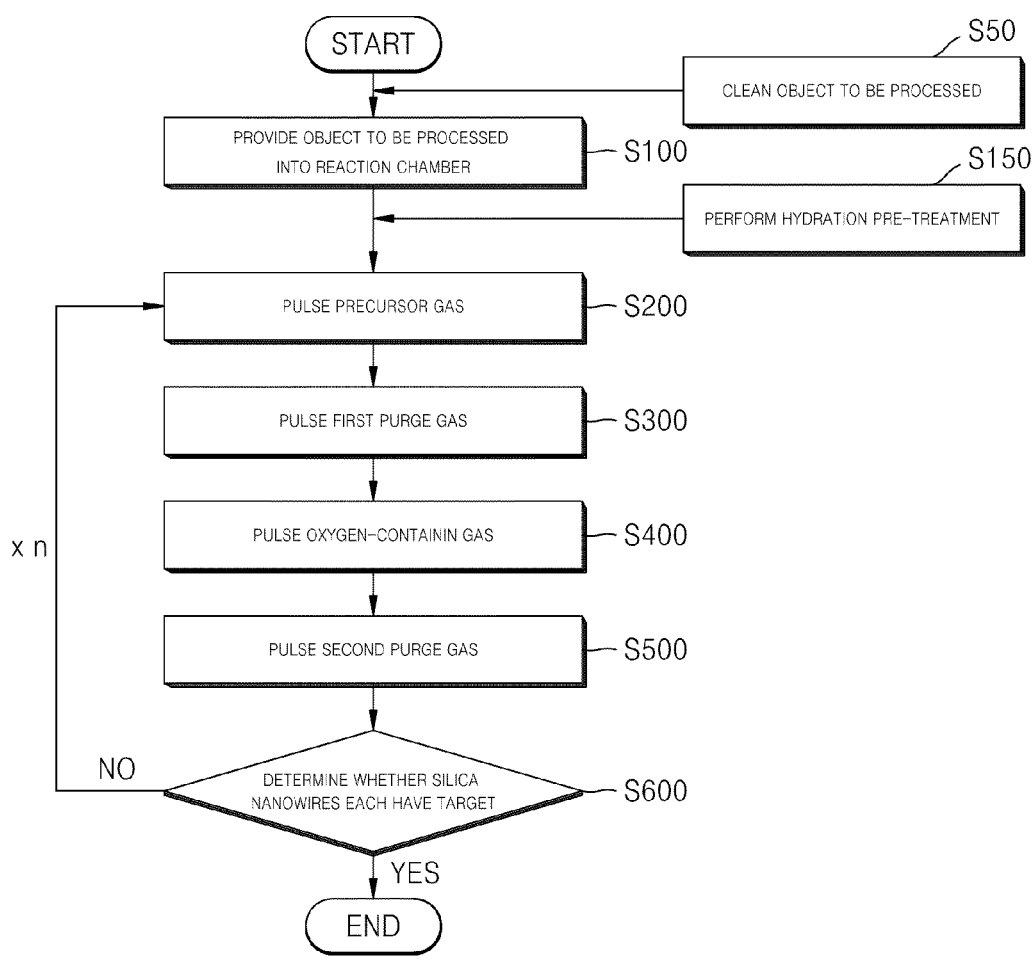
FIG. 9 is a flowchart illustrating a method of manufacturing silica nanowires by using atomic layer deposition, according to an embodiment of the present invention.

FIG. 9 is a flowchart illustrating a method of manufacturing silica nanowires by using atomic layer deposition, according to an embodiment of the present invention.

Referring to FIG. 9, in operation S100, in order to manufacture nanowires, an object to be processed, for example, a substrate, is provided on a support unit in a reaction chamber 204. A single or a batch of substrates may be loaded as well known in the art, and may be transferred to the reaction chamber from a loadlock chamber by an appropriate robot system.

In some embodiments, in operation S50, before the object to be processed is provided into the reaction chamber, a surface of the object to be processed may be cleaned. The object to be processed may be cleaned by being dipped, for example, 5 minutes, in alcohol such as ethanol or isopropyl alcohol as described above. In some embodiments, the object to be processed may be cleaned by using ultrasonic energy. Also, after the cleaning, the object to be processed may be rinsed with DI water. Due to the cleaning, a hydroxyl group may be formed on the surface of the object to be processed, for example, a surface of a silicon substrate.

Next, in operation S200, a precursor gas is pulsed into the reaction chamber. The precursor gas may be a bis(ethyl-methyl-amino) silane compound having a heteroleptic structure that may be expressed by a chemical formula $SiA_2B_2$. However, the bis(ethyl-methyl-amino) silane compound is exemplary and another heteroleptic compound may be used. An amine group S5 of the silane compound, which is a preferentially reactive functional group than a hydrogen group, undergoes a condensation reaction with a hydroxyl group S1 on a surface of a silicon substrate like in step 1 of FIG. 5B, and is chemisorbed as a single or less than a single layer on the silicon substrate. Such a reaction occurs to form one layer in one pulse, and a remaining precursor may no longer participate in a reaction, which may be called as a self-limiting process.

Next, in operation S300, in order to remove an excess precursor gas remaining in the reaction chamber and a $H_2O$ gas, which is a redundant reaction product, a purge gas is pulsed into the reaction chamber. The purge gas may be an inert gas, for example, Ar or He.

Next, in operation S400, an oxygen-containing gas reacting with a functional group of an intermediate absorbed onto the silicon substrate, that is, an amine group at the other end of the silane compound is pulsed. The oxygen-containing gas may be, for example, a $H_2O$ gas that may replace the amine group with a hydroxyl group. The $H_2O$ gas undergoes a condensation reaction with the amine group of the absorbed silane compound to remove $HN(CH_3)(C_2H_5)$ and provide a hydroxyl group to the absorbed intermediate. Accordingly, all intermediates attached to silicon atoms of the silicon substrate may have hydroxyl groups as shown in step 2 of FIG. 5B.

If the amine group of the absorbed silane compound is all consumed, an excess oxygen-containing gas has a self-limiting feature in that the excess oxygen-containing gas may no longer participate in a reaction. Likewise, in operation S500, a purge gas is pulsed into the reaction chamber, to remove a residual oxygen-containing gas remaining in the reaction chamber and $HN(CH_3)(C_2H_5)$ which is a reaction product. The purge gas may be, for example, Ar or He.

Figure 10:
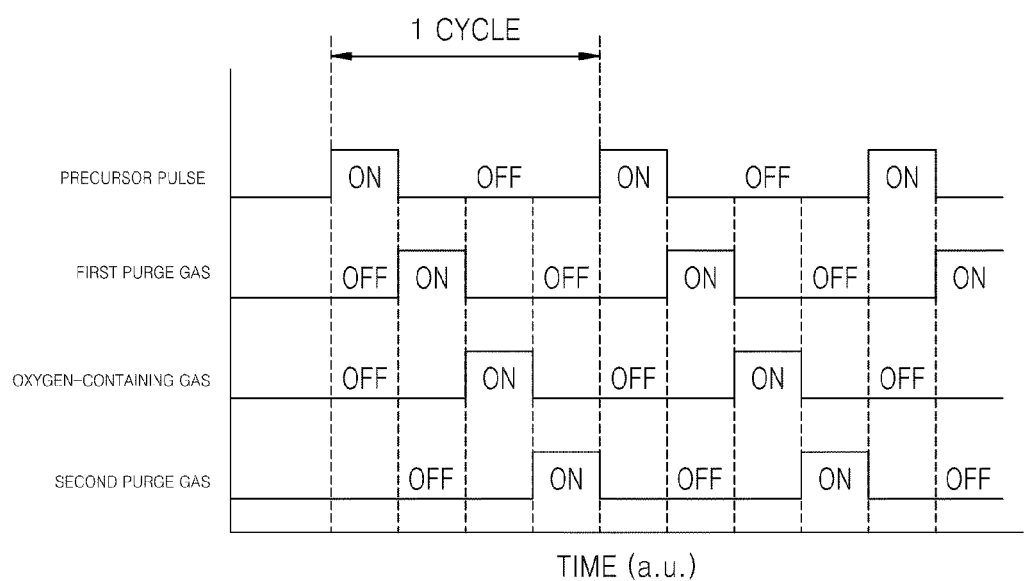
FIG. 10 is a graph illustrating pulse switching in operations S200 through S500.

FIG. 10 is a graph illustrating pulse switching in operations S200 through S500.

Referring to FIG. 10, pulses of a precursor and an oxygen-containing gas are alternately provided, and pulses of a first purge gas and a second purge gas are provided between the pulses of the precursor and the oxygen-containing gas. In FIG. 10, although the purses of the precursor and the oxygen-containing gas do not overlap with each other, the pulses may overlap with each other in order to control shapes or growth rates of silica nanowires in modified examples.

Referring to FIGS. 9 and 10, in operation S600, one cycle including these pulses, that is, operations S200 to S500, may be repeated until silica nanowires having a target length are manufactured. A reasonable deposition rate may be obtained by fast switching of operations S200 to S500, for example, a pulse equal to or less than 3 seconds. The present inventors obtained a deposition rate of about 2 Å/cycle at room temperature.

Shapes of Silica Nanowires

It has been described that silica nanowires are one-dimensionally grown in a direction substantially perpendicular to a surface of an object to be processed. However, shapes of silica nanowires may be controlled by changing a process pressure in a reaction chamber to induce a horizontal growth of the silica nanowires.

Figure 11A:
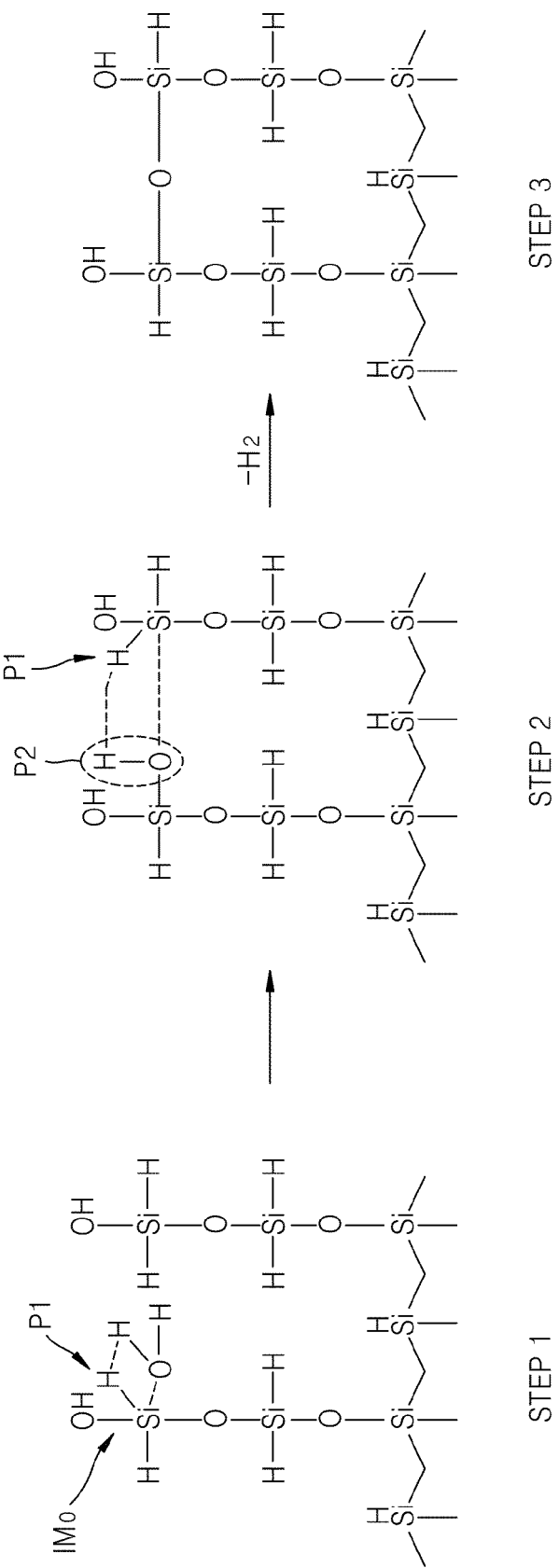
Figure 12:
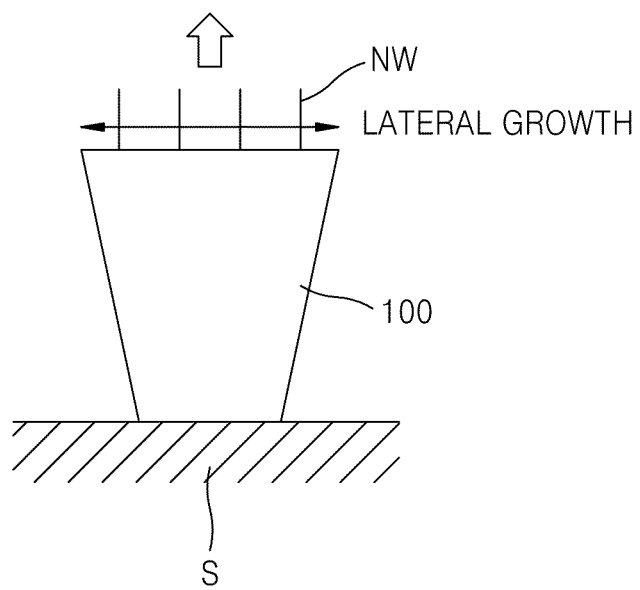
FIG. 12 conceptually illustrates a change in shapes of silica nanowires due to a cross-linking reaction between intermediates while the silica nanowires are grown.

FIGS. 11A and 11B conceptually illustrate a cross-linking reaction between intermediates formed on a surface of a silicon substrate by using a precursor having a heteroleptic structure that is expressed by a chemical formula $SiA_2B_2$. FIG. 12 conceptually illustrates a change in shapes of silica nanowires due to a cross-linking reaction between intermediates while the silica nanowires are grown.

Referring to FIG. 11A, as in each of intermediates IM attached to the surface of the silicon substrate, an amine group which is preferentially reactive is removed, a hydrogen group P1 attached to a silicon atom is available to participate in a reaction. Accordingly, the hydrogen group P1 attached to the silicon atom may react with an oxygen-containing gas, for example, $H_2O$, supplied to the surface of the silicon substrate. Thus, the hydrogen group P1 may be replaced with a hydroxyl group (step 1). Hydroxyl groups P2 of the intermediates IM may be coupled to hydroxyl groups P1 of adjacent silicon intermediates (step 2). Next, $H_2$ is removed and a cross-linking reaction for attaching silicon atoms by an oxygen atom between neighboring intermediates occurs (step 3). If such a horizontal cross-linking reaction is dominant, silica nanowires are primarily grown in a direction perpendicular to the surface of the silicon substrate (or a longitudinal direction of the silica nanowires) and at the same time are grown in a horizontal direction (or a width direction of the silica nanowires), and thus have a tapered shape (or a cone shape) as shown in FIG. 12.

Referring to FIG. 11B, similarly, in intermediates IM attached to the surface of the silicon substrate, all hydrogen groups P1 attached to silicon atoms may be replaced with hydroxyl groups P2 due to a $H_2O$ gas supplied into the reaction chamber (step 1). The hydroxyl groups P2 of the intermediates IM may be coupled to hydroxyl group P2 of adjacent silicon intermediates IM (step 2). Next, $H_2O$ is removed and a cross-linking reaction for attaching silicon atoms by an oxygen atom between neighboring intermediates occurs (step 3). Likewise, due to such a cross-linking reaction, a horizontal growth of silicon nanowires may be induced, and accordingly, silicon nanowires may have tapered shapes as shown in FIG. 12.

As such, a lateral growth of silicon nanowires may occur due to a cross-linking reaction between intermediates formed on a silicon substrate. As described above with reference to FIGS. 7A and 7B, as a pressure decreases, for example, from a pressure of 1 Torr to 2 Torr, a lateral growth is accelerated and silica nanowires having tapered shapes may be obtained. Also, as described above with reference to FIGS. 7C and 7D, a degree of a lateral growth and a longitudinal growth may be controlled by appropriately adjusting a flow rate of a reaction gas transferred to a silicon substrate. In this case, nanowires having uniform widths may be obtained.

Figure 13:
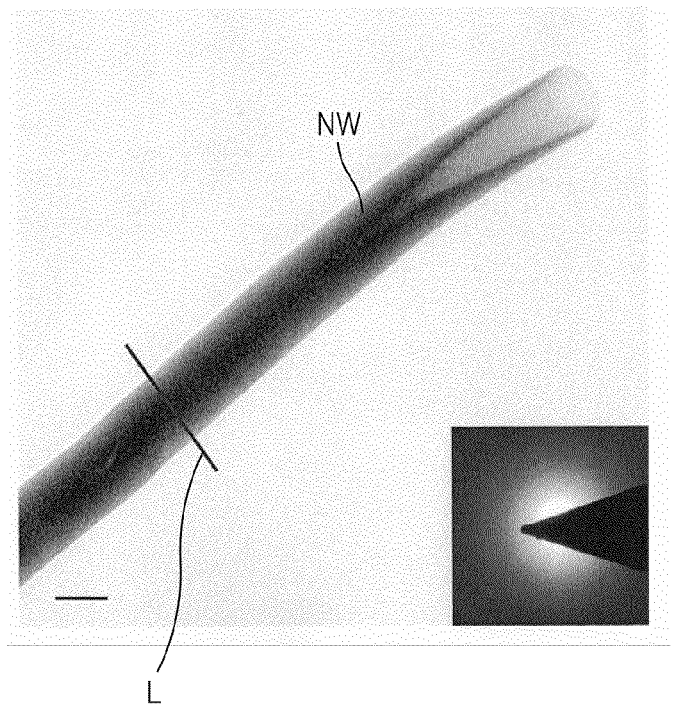
FIG. 13 is a transmission electron microscopic (TEM) image of silica nanowires obtained from embodiments of the present invention.

FIG. 13 is a transmission electron microscopic (TEM) image of silica nanowires NW obtained from embodiments of the present invention. A small image 13P is a selected area electron diffraction (SAED) image, and a scale bar is 50 nm.

Referring to FIG. 13, the TEM image has a uniform contrast over the entire silica nanowires NW. This means that not nanotubes but nanowires are grown. In a conventional vapor-liquid-solid (VLS) growth method using a metal catalyst, a growth region under the metal catalyst is completely filled with silica to have a uniform contrast. However, an end portion of each of silicon nanowires illustrated in FIG. 13 has a contrast different from that of a bulk region. Also, since the SAED image has a highly diffusive or dispersive diffraction pattern, it is found that silica nanowires according to an embodiment of the present invention are amorphous.

Figure 14:
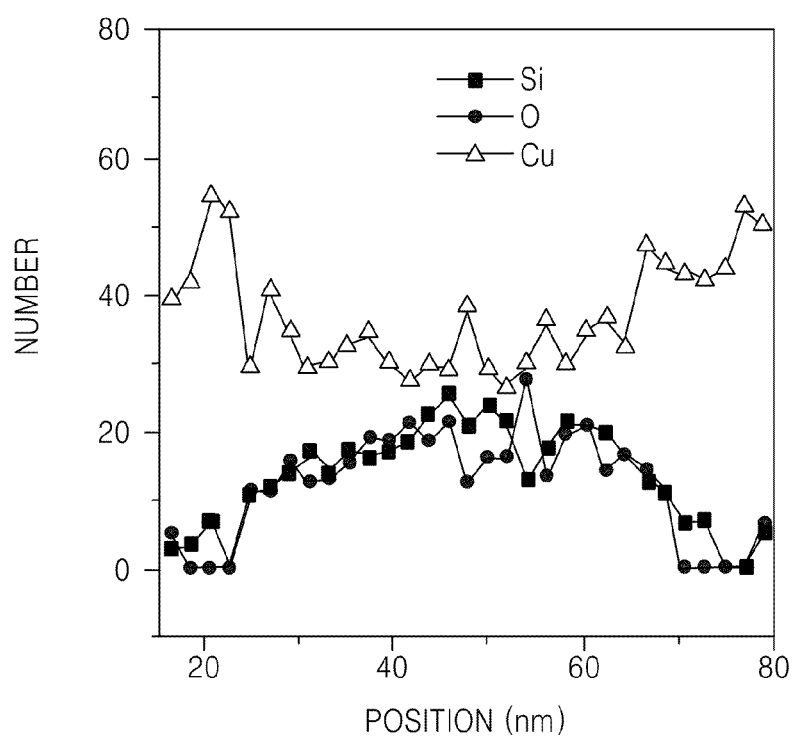
FIG. 14 is a graph illustrating a result of energy dispersive X-ray (EDX) analysis performed along a solid line portion of FIG. 13.

FIG. 14 is a graph illustrating a result of energy dispersive X-ray (EDX) analysis performed along a solid line of FIG. 13.

Referring to FIG. 14, after the EDX analysis, silicon (Si), oxygen (O), and copper (Cu) were detected. A copper signal is a signal originated from a copper grid for supporting a measured sample. Since silicon and oxygen signals overlap with each other, it is found that silicon and oxygen are uniformly distributed in silica nanowires. Also, the reason why silicon and oxygen profiles are convex seems that the insides of the silica nanowires are completely filled.

Figure 15:
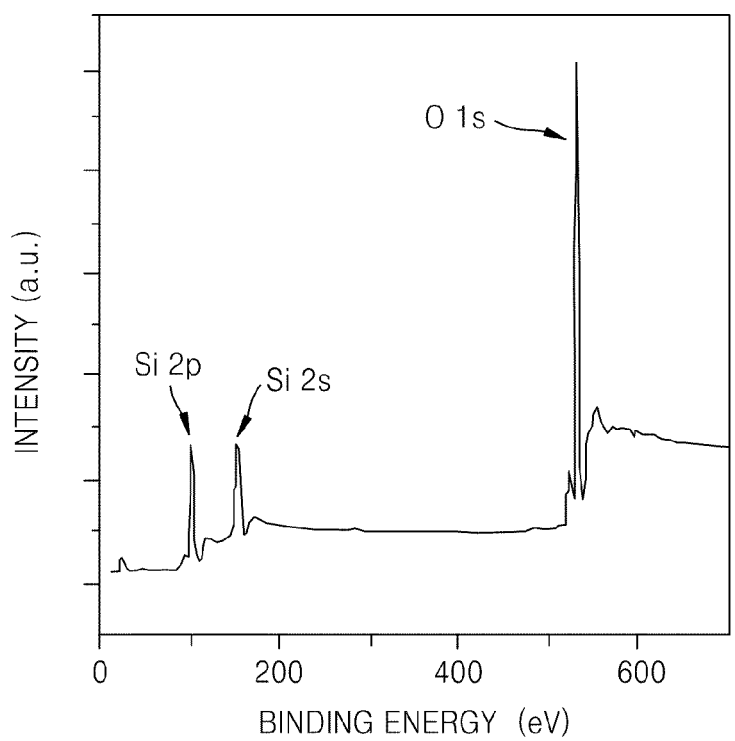
FIG. 15 is a graph illustrating a result of X-ray photoelectron spectroscopy (XPS) performed on silica nanowires manufactured according to an embodiment of the present invention.

FIG. 15 is a graph illustrating a result of X-ray photoelectron spectroscopy (XPS) performed on silica nanowires manufactured according to an embodiment of the present invention.

Referring to FIG. 15, only peaks of silicon and oxygen were observed but peaks of carbon (C) (about 285 eV) and nitrogen (N) (about 398 eV) were not observed. It is found that silica nanowires are mainly formed of silicon and oxygen. Also, since a composition ratio of silicon and oxygen is about 1:2 from an analysis result, it is found that the composition of the silica nanowires seems to be close to $SiO_2$.

Figure 16:
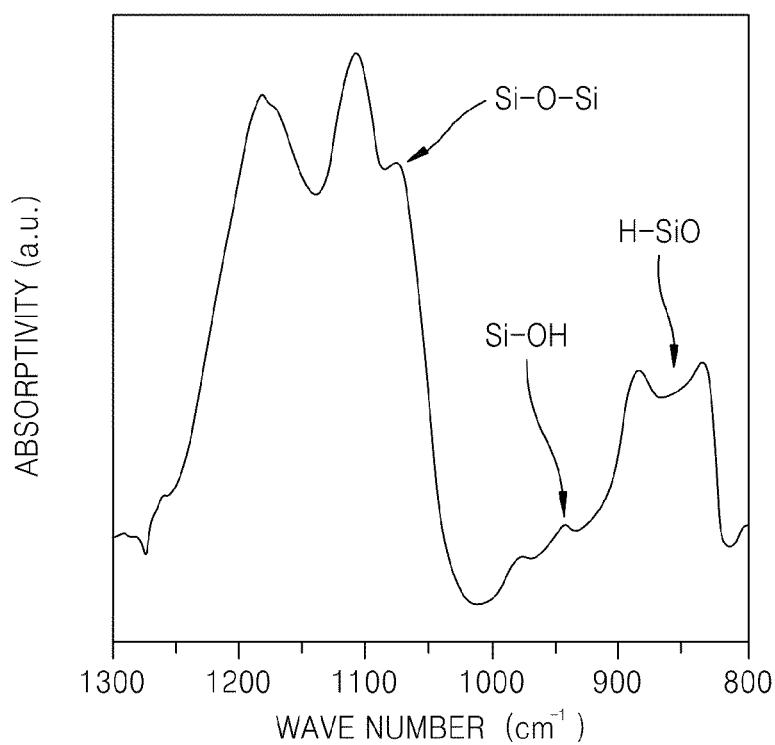
FIG. 16 is a graph illustrating a result of Fourier transform infrared spectroscopy (FTIR) performed on silica nanowires manufactured according to an embodiment of the present invention.

FIG. 16 is a graph illustrating a result of Fourier transform infrared spectroscopy (FTIR) performed on silica nanowires manufactured according to an embodiment of the present invention.

Referring to FIG. 16, an absorption band was detected between 837 $cm^{-1}$ and 885 $cm^{-1}$ due to a H—SiO bending mode. Since a Si—N bond peak was not observed, it is found that an amine group is preferentially and completely replaced with a hydroxyl group due to a water molecule. The H—SiO bending mode seems to be derived from outer surfaces of silica nanowires. The outer surfaces terminated with hydrogen seem to play an important role in making a longitudinal growth of the silicon nanowires more dominant than a lateral growth.

COMPARATIVE EXAMPLE

Figure 17A:
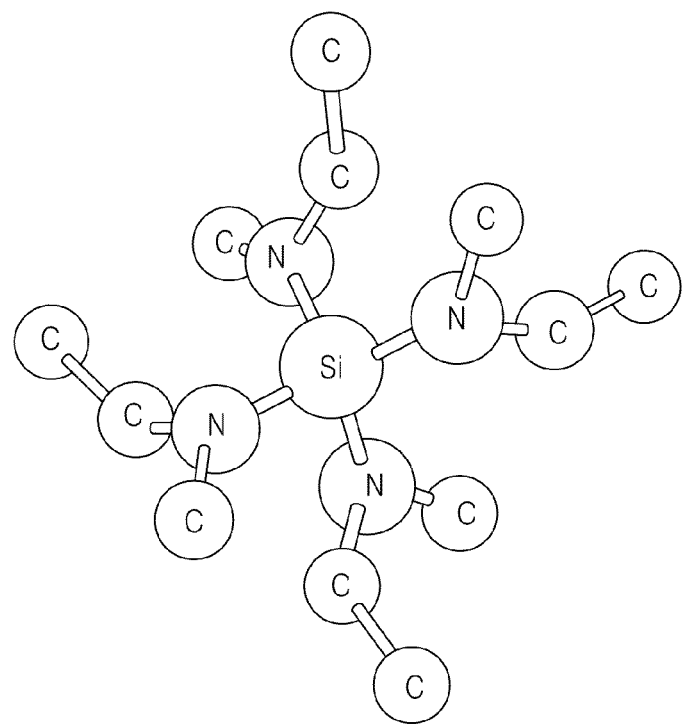
FIG. 17A illustrates a terakis(ethylmethylamino) silane compound having a homoleptic structure as a comparative example.
Figure 17B:
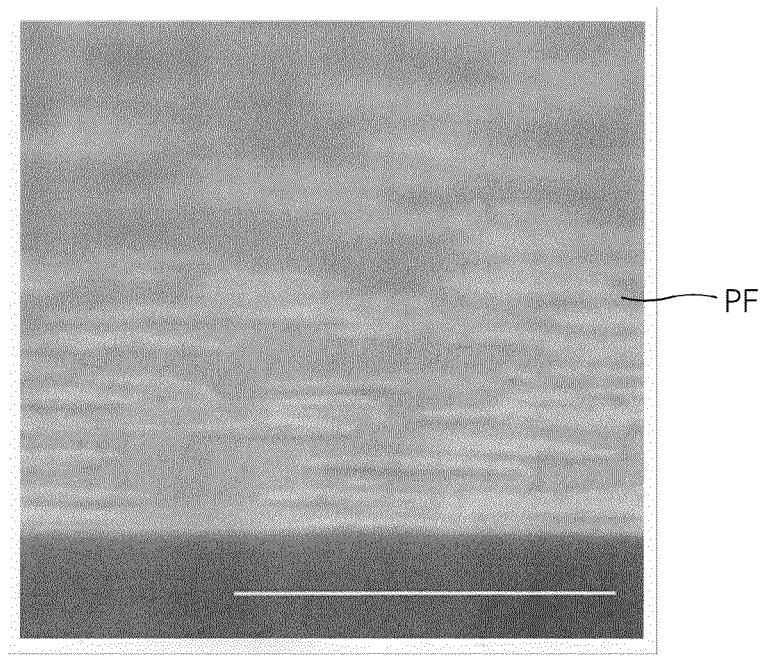
FIG. 17B is a scanning microscopic image of a resultant structure deposited by using the compound of FIG. 17A as a precursor.

FIG. 17A illustrates a terakis(ethylmethylamino) silane compound having a homoleptic structure as a comparative example. FIG. 17B is a scanning microscopic image of a resultant structure deposited by using the compound of FIG. 17A as a precursor.

In the terakis(ethylmethylamino) silane compound illustrated in FIG. 17A, functional groups attached to a silicon atom are the same, and all of the functional groups have reactivities. Accordingly, a functional group at a specific position does not selectively undergo a hydrolysis reaction with a $H_2O$ gas and is not replaced with a hydroxyl group.

A chemical vapor deposition process was performed on a silicon substrate for 10 minutes at room temperature at a pressure of 7 Torr by using the terakis(ethylmethylamino) silane compound as a precursor. As shown in FIG. 17B, if a silicon compound precursor having a homoleptic structure is used, a two-dimensional film structure PF uniformly grown not only in a longitudinal direction but also in a lateral direction on a surface of a silicon substrate was obtained, but any nanowires were not formed.

Silica nanowires formed according to an embodiment of the present invention may be grown at a high growth rate at room temperature without using a catalyst, and may be one-dimensionally grown uniformly.

Since silica nanowires may be formed at room temperature, a limitation of an object to be processed is relaxed. For example, silica nanowires may also be formed on a polymer-based substrate that is vulnerable to heat, according to an embodiment of the present invention.

Also, silica nanowires obtained by using a heteroleptic precursor may have a very high-quality alignment in a direction perpendicular to a surface of an object to be processed, may have, for example, a magnetic effect, optoelectronic effect, chemical sensing effect, phonon transport effect, or ion transport effect, by themselves or with other materials, and may improve optical, electrical, magnetic, mechanical, or chemical functions when being used for an optical device, an optoelectronic device, a super conducting device, a memory device, electrical energy storage device, or display device.

Also, by coating at least one material layer formed of a metal, such as Si, Ge, Cu, Ni, Cr, Fe, Ag, Ti, Co, Zn, Mg, Pt, Pd, Os, Au, Pb, Ir, Mo, V, or Al, an alloy thereof, a metal oxide such as $SnO_2$, $Cr_2O_3$, $Fe_2O_3$, $Fe_3O_4$, FeO, NiO, AgO, $TiO_2$, $Co_2O_3$, $Co_3O_4$, CoO, ZnO, PtO, PdO, $VO_2$, $MoO_2$, or PbO, a polymer such as polyimide, or a combination thereof having a stacked structure such as Ti/$TiO_2$ on outer surfaces by using silica nanowires as templates, a nanostructure array for providing a predetermined optical, electrical, magnetic, mechanical, or chemical function may be provided. The materials coated on the silica nanowires may be formed by a well-known thin film deposition method such as chemical vapor deposition, atomic layer deposition, or sputtering.

In some embodiments, after the material layer is coated, by removing the silica nanowires, a nanostructure array in which only the at least one material layer remains may be provided. As such, the silica nanowires used as templates may remain in the nanostructure array according to a device manufacturing method or may be removed by dry etching using plasma or wet etching using HF.

It would be understood by one of ordinary skill in the art that another heteroleptic structure of C, Ge or other metals as a central atom is applicable to manufacture a nanowire structure according to the teaching of the present invention and these embodiments are all in the scope of the present invention.

As described above, a method of manufacturing silica nanowires according to the embodiments of the present invention provides silica nanowires which are grown in a one-dimensional linear direction due to a substrate-selective chemical reaction by using an oxygen-containing gas and a precursor having a heteroleptic structure that has a chemical formula $SiA_2B_2$ (A and B are different functional groups). Also, the method may rapidly manufacture silica nanowires without a catalyst even at room temperature, and may easily control sizes and shapes of silica nanowires by controlling process conditions, particularly, a pressure.

Also, a method of manufacturing a nanostructure array according to the embodiments of the present invention provides a nanostructure array by coating a metal, a metal oxide, a semiconductor, a polymer, or a combination thereof on outer surfaces of the silica nanowires having the aforesaid advantages by using the silica nanowires as templates.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing silica nanowires, the method comprising:
   providing an object to be processed into a reaction chamber;
   supplying a bis(ethyl-methyl-amino) silane precursor having a heteroleptic structure, which has a chemical formula $SiH_2[N(CH_3)(C_2H_5)]$, into the reaction chamber;
   supplying an oxygen-containing gas that preferentially reacts with the amine group $—N(CH_3)(C_2H_5)$ of the precursor; and
   growing an intermediate on a surface of the object to be processed due to a reaction between the precursor and the oxygen-containing gas,
   wherein the reaction between the precursor and the oxygen-containing gas continuously occurs only in a direction in which the amine group $—N(CH_3)(C_2H_5)$ is attached to Si.

2. The method of claim 1, wherein the intermediate undergoes a condensation reaction with the precursor and the oxygen-containing gas.

3. The method of claim 1, wherein the oxygen-containing gas comprises a hydroxyl group.

4. The method of claim 1, wherein the oxygen-containing gas is $H_2O$.

5. The method of claim 1, further comprising, before the supplying of the precursor, hydrating the surface of the object to be processed.

6. The method of claim 1, wherein a temperature of the object to be processed is maintained between 20° C. and 30° C.

7. The method of claim 1, wherein a pressure of the reaction chamber is determined in order to control a longitudinal growth and a lateral growth of the silica nanowires.

8. A method of manufacturing silica nanowires, the method comprising:
   providing an object to be processed into a reaction chamber;
   pulsing a bis(ethyl-methyl-amino) silane precursor having a heteroleptic structure, which has a chemical formula $SiH_2[N(CH_3)(C_2H_5)]$, into the reaction chamber;
   pulsing a purge gas into the reaction chamber in order to remove an excess precursor gas remaining in the reaction chamber after forming a first intermediate by a first reaction between the precursor and a surface of the object to be processed;
   supplying an oxygen-containing gas that preferentially reacts with the functional group $—N(CH_3)(C_2H_5)$ of the precursor;
   pulsing a purge gas into the reaction chamber in order to remove the excess oxygen-containing gas remaining in the reaction chamber after forming a second intermediate by a second reaction between the oxygen-containing gas and the surface of the object to be processed; and
   repeating operations ranging from the pulsing of the precursor to the pulsing of the purge gas at least one time,
   wherein the reaction between the precursor and the oxygen-containing gas continuously occurs only in a direction in which the amine group $—N(CH_3)(C_2H_5)$ is attached to Si.

9. The method of claim 8, wherein the first and second reactions comprise at least one of a hydrolysis reaction and a condensation reaction.

10. The method of claim 8, further comprising, before the pulsing of the precursor, hydrating the surface of the object to be processed.

11. The method of claim 8, wherein the method is maintained at a temperature between 20° C. and 30° C. that is room temperature.

12. A method of manufacturing a nanostructure array, the method comprising: after forming silica nanowires by the method of claim 1, coating at least one material layer formed of a metal, a metal oxide, a polymer, or a combination thereof, on outer surfaces of the silicon nanowires by using the silica nanowires as templates.

13. The method of claim 12, further comprising leaving only the at least one material layer behind by removing the silica nanowires.

* * * * *